United States Patent [19]

Nutter

[11] Patent Number: 5,216,671
[45] Date of Patent: Jun. 1, 1993

[54] HIGH SPEED BIT SERIAL SYSTEMS

[75] Inventor: Robert F. Nutter, West Windsor, N.J.

[73] Assignee: RCA Licensing Corporation, Princeton, N.J.

[21] Appl. No.: 627,129

[22] Filed: Dec. 13, 1990

[51] Int. Cl.[5] .............................................. H04J 3/00
[52] U.S. Cl. ...................................... 370/112; 328/105
[58] Field of Search ................... 370/112, 97; 328/104, 328/105; 307/243, 244

[56] References Cited

U.S. PATENT DOCUMENTS

| | | | |
|---|---|---|---|
| 4,381,562 | 4/1983 | Acampora | 370/97 |
| 4,713,809 | 12/1987 | Mizota | 370/97 |
| 4,787,032 | 11/1988 | Culley | 364/200 |
| 4,789,984 | 12/1988 | Swartz | 370/112 |
| 4,791,628 | 12/1988 | Swartz | 370/112 |
| 4,901,310 | 2/1990 | Ichiyoshi | 370/97 |
| 4,924,459 | 5/1990 | Angell et al. | 370/84 |
| 4,949,339 | 8/1990 | Shimada et al. | 370/112 |

Primary Examiner—Douglas W. Olms
Assistant Examiner—Min Jung
Attorney, Agent, or Firm—Joseph S. Tripoli; Eric P. Herrmann; Ronald H. Kurdyla

[57] ABSTRACT

A limiting factor in the operating speed of a bit-serial integrated circuit is the stray capacitance associated with interconnections of functional elements on the integrated circuit, which stray capacitance tends to be significantly larger than capacitances at signal nodes internal to a functional element. To overcome the limitations imposed by the capacitance associated with the interconnections, bit-serial signals are coupled from one functional element to another by multiplexing circuitry which splits the bit-serial signal provided by a functional element into parallel bit-serial-signals of lesser bit-rate, and then recombines the parallel signals for application to another functional element.

5 Claims, 4 Drawing Sheets

HIGH SPEED BIT SERIAL SYSTEMS

This invention relates to bit-serial digital circuitry.

BACKGROUND OF THE INVENTION

Progress in integrated circuit technology has fostered digital signal processing systems (DSP's) for performing functions which heretofore were performed in the analog signal domain. Examples of such DSP's are digital television receivers, compact disc players and digital video interactive (DVI) systems.

There are two basic types of DSP's which are parallel bit systems, and bit-serial systems. Typically, parallel-bit systems have been employed for all systems processing relatively wide bandwidth signals because system operating rates are lower. That is, for a given sample bit width N, the parallel-bit systems operate at $1/N^{th}$ the rate of bit-serial systems. However, the parallel-bit systems require significantly more circuitry than the bit-serial systems. Because of the greater complexity and larger power dissipation of parallel-bit systems it is desirable to realize many of the wide band systems with bit-serial circuitry. Unfortunately, the processing rates of such bit-serial systems are near or exceed the limit of current technologies.

Consider a video signal processing system operating at sample rates of 14.32 MHz with samples having bit-widths of 8 bits. A bit-serial system for processing such a signal must operate at clock rates of at least 115 MHz. Desirably the system will be realized in metal-oxide-semiconductor (MOS) technology because of its higher circuit density and lower power requirements. However, signal processing rates of 115 MHz tend to be very near the limit of current MOS technology.

One of the limiting factors is manifested by timing errors, particularly between different functional elements of a particular system. These errors result from the relatively low drive capability of MOS transistors. Nominally all of the functions on an DSP integrated circuit (IC) are operated synchronously with common clock signals. Now if an interconnection between functional elements tends to be longer than typical interconnections within a functional element, it will exhibit a larger capacitance. This larger capacitance can load the output of a functional element causing timing errors between elements and thus limit the speed of the overall system. Even within a functional element, connections may exist which exhibit a capacitance of sufficient value to create timing errors.

The present invention advantageously circumvents the adverse consequences of large interelectrode capacitances in bit-serial systems, thereby increasing the overall processing rate of such systems.

SUMMARY OF THE INVENTION

The relative maximum operating speed of a bit-serial integrated circuit is increased by including first and second multiplexers in signal paths exhibiting relatively large stray capacitance. The first multiplexer is located at the input to the high capacitance signal path and splits the bit-serial signal occurring at a bit rate f, to N signal paths each at a bit rate f/N. At the output end of the high capacitance path the second multiplexer recombines the N signal paths each carrying bit-serial signals at rate f/N to a single bit serial signal of bit rate f. The multiplexer are operated with common clock signals to maintain the bit-serial signals synchronous.

DETAILED DESCRIPTION

Figure 1A:
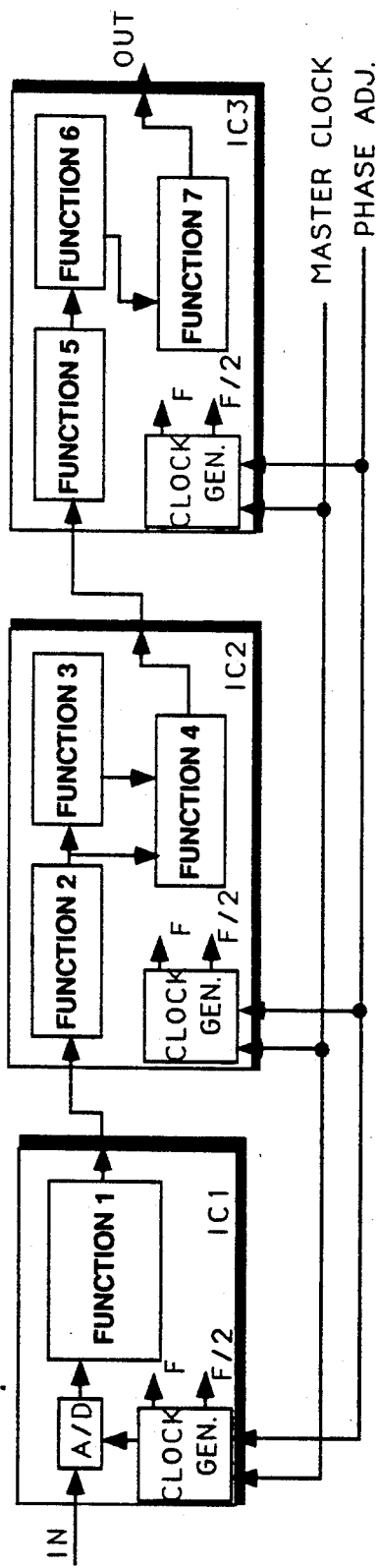
FIG. 1A is a block diagram of a bit-serial signal processing system embodying the invention.

FIG. 1A illustrates the overall system concept of the bit-serial processing apparatus of the present invention. This exemplary system includes three integrated circuits for performing the desired signal processing. Each integrated circuit includes a clock generator and one or more processing functions. An analog signal is applied to IC1 wherein it is converted to a bit-serial digital signal by an analog-to-digital converter (A/D). The bit-serial signal is operated on by a bit-serial signal processing circuit (FUNCTION 1) and then passed to the second integrated circuit IC2. In IC2 the bit-serial signal undergoes three further operations in the functional circuitry FUNCTION 2, FUNCTION 3 and FUNCTION 4. The bit-serial signal is then passed to IC3 wherein it undergoes further processing and then is provided as a processed output signal, OUT. The last-most processing function (FUNCTION 7) may be a digital-to-analog conversion.

The presumption is made that the signal being processed is of wide bandwidth thereby requiring the integrated circuits to operate at a relatively high bit rate. The problem of distributing global timing signals is accomplished by applying relatively low rate clock signals, provided by a master clock signal generator, to the different IC's. The master clock signal may correspond to the sample rate (e.g., the sample rate for a video signal processing system may be 14.32 MHz and the bit rate will be N times the sample rate, where N corresponds to the number of bits per sample). The high bit rate clock signals are generated on each integrated circuit by a clock generator responsive to a master clock signal, and this high rate clock signal is distributed to the different functional elements within an IC. The functional elements may include clock buffer circuits for buffering the clock signals before application to the devices in the functional element. Each clock generator within an IC may include an oscillator configured in a phase-locked-loop to provide clock signals which are phase locked to the master clock. In addition each clock generator may include circuitry responsive to a phase/frequency control signal for adjusting the relative phase or frequency of the generated clock signals. Employing a lower frequency master clock signal for global synchronization, and constraining the high speed clocks to the respective integrated circuits reduces the generation of undesirable radio frequency interference (RFI).

Figure 1B:
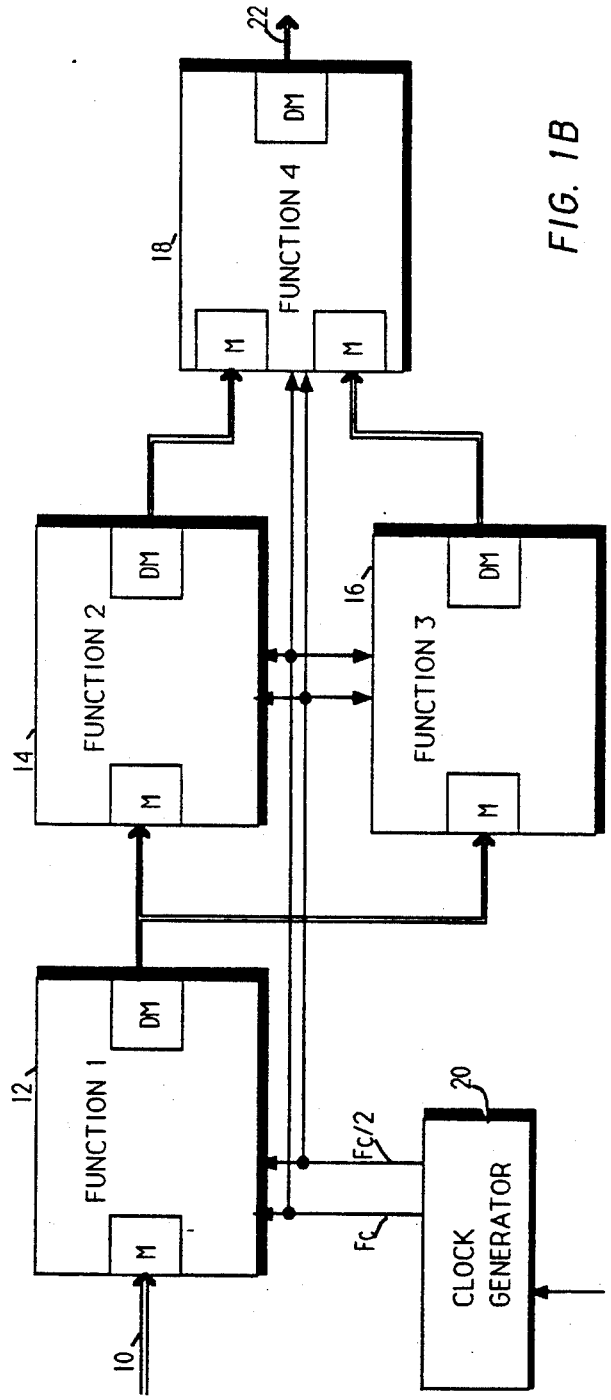
FIG. 1B is a block diagram of an exemplary integrated circuit embodying the present invention.

FIG. 1B illustrates in block form a portion of an exemplary integrated circuit (IC) of the type which may be employed in FIG. 1A. The exemplary IC includes bit-serial functional elements 12-18. On a video signal processing IC, for example, these elements may represent, in combination, a luminance peaking filter with Functions 1 and 2 being lowpass filter functions, Function 3 being a bandpass filter function and Function 4 being an adder. All of the functional elements may be located relatively close to one another on the IC, however the interfunction connecting electrodes may be one or two orders of magnitude longer than any of the intrafunctional element connections. Consequently the interfunctional connections may exhibit stray capacitances which are one or two orders of magnitude greater than the stray capacitance at any intrafunction circuit node and thus provide the limiting parameter to the processing rate of the system.

The rate of change of potential, dv/dt, at any signal node is given by $$dv/dt = i(t)/C$$

where i(t) is the current available to charge or discharge the node, and C is the total capacitance associated with the node. The current i(t) is nominally provided by either a pull-up transistor to raise the node to a logic high potential or a pull-down transistor to discharge the node to a logic low potential. All other things remaining constant, the rate of change of node potentials, and by implication the maximum processing rate, is inversely proportional to the capacitance. The available charge/discharge current may be increased, to compensate for an increased capacitance by increasing the size and thereby the transconductance of the pull-up and pull-down transistors. However, those persons skilled in the art of IC design will appreciate that increasing the size of the transistors of a particular stage in the circuitry will also increase the load (node) capacitance of the previous stage. Thus rate gains at one stage may be counteracted, at least in part by rate losses in a previous state.

The alternative to increasing the node charge/discharge currents to compensate for larger capacitances is to increase the time dt available to charge a respective node. This is accomplished, with respect to bit-serial signals, by dividing the signal into two (or N) parallel signals each of which has a bit rate of one half (1/N) the bit rate of the original signal. Having circumvented the larger capacitance the parallel signals are recombined to form a signal bit-serial signal having the original bit rate.

In FIG. 1B each of the functional elements are shown incorporating demultiplexers (DM) at their respective output connections. These demultiplexers are arranged to divide a bit-serial signal of rate f into N parallel bit-serial signals of rate f/N. At the input connection of each functional element is a multiplexer (M) which accepts N parallel bit-serial signals having bit rates f/N and combines the N parallel bit-serial signals into a single bit-serial signal of rate f. Internally each of the functional elements operate at the rate f.

Figure 2:
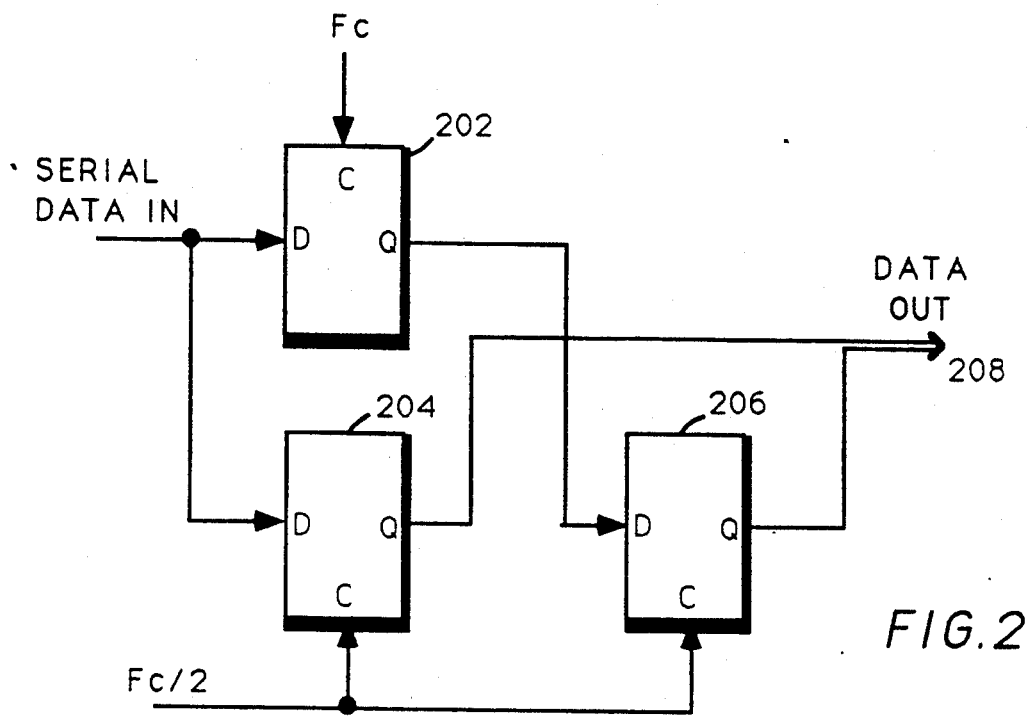
FIGS. 2 and 5 are schematic logic diagrams of exemplary multiplexers which may be utilized in the functional elements of FIG. 1B.
Figure 5:
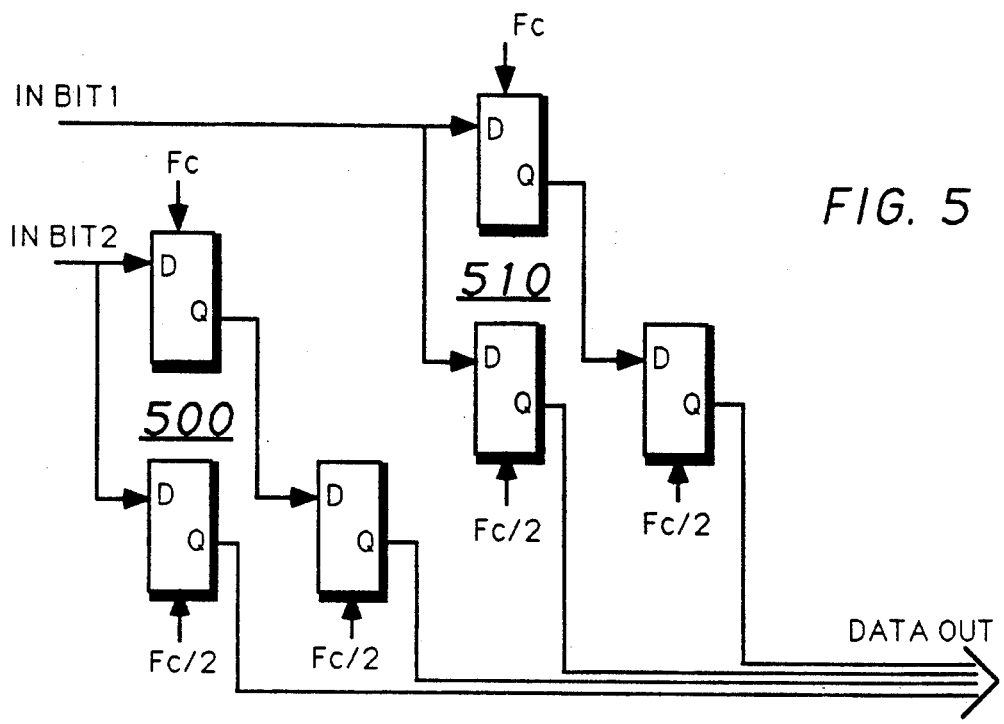

FIGS. 2 and 5 illustrate alternative embodiments of exemplary demultiplexer circuitry (DM) which may be implemented in the FIG. 1B circuitry. The demultiplexer illustrated in FIG. 2 parses a bit-serial signal of bit rate fc into two bit-serial signals each of bit rate fc/2. The FIG. 5 demultiplexer parses two bit-serial signals into four parallel bit serial signals.

Operation of the circuitry of FIG. 2 will be described with reference to the signals illustrated in FIG. 4. In FIG. 2 the input bit-serial signal DATA IN is applied to the data input terminal of a register 202 (D-type latch) which is clocked by the signal Fc synchronous with the bit-serial input signal. The output of the register 202 is a replica of its input signal but delayed by one bit period. The output of register 202 is applied to the data input terminal of a register 206. The input signal is also applied to the data input terminal of a register 204. Registers 204 and 206 are clocked by a half rate clock signal Fc/2.

At time t2 (FIG. 4) register 202 provides a data bit Si to the input terminal of register 206 and an input data bit Si+1 is applied to register 204. At the positive transition of the clock signal Fc/2 these two bits (i.e., S1 and S2) are respectively loaded into registers 206 and 204. These bits are subsequently output on parallel output connections 208. At time t3 the input signal bit S4 is applied to register 204 and bit S3 is applied to register 206. These bits are concurrently loaded into registers 204 and 206 at the positive transition (t3) of the clock signal Fc/2 and thereafter coupled to the parallel output connections 208. In this manner the input signal occurring at rate fc is parsed into two signals occurring at a bit rate of fc/2 on the parallel output connection 208. The relationship of the bit-serial input data to the two parallel output bit-serial signals may be seen from the signals DATA IN, REG. 206 and REG. 204 illustrated in FIG. 4.

The capacitance exhibited on the input connections to registers 202 and 204 will be typical of the capacitances exhibited by devices internal to the functional element and thus can be driven by a typical internal transistor. The capacitance exhibited by each of the output connections 208 may be significantly larger. However, since the data rate at the output connections has been halved, these connections may also be driven by transistors similar to the internal transistors. As such the demultiplexer does not load the internal circuitry, the output connections do not unduly load the demultiplexer, and the system can operate at rates defined by rate limiting parameters of the functional elements rather than rate limiting parameters of the circuitry coupling the functional elements.

The demultiplexer illustrated in FIG. 5 is simply two demultiplexers 500 and 510 of the type illustrated in FIG. 2 and operating in parallel.

Note that a demultiplexer of the FIG. 2 type may be utilized as an input circuit to the FIG. 5 demultiplexer to provide four parallel signals at ¼ the original bit rate. A further alternative arrangement may comprise a four stage shift register operating at the clock frequency Fc. An output from each of the four stages may be applied to four further registers clocked by a clock signal of frequency fc/4. The four further registers will provide four parallel signals at one quarter the original bit rate.

Figure 3:
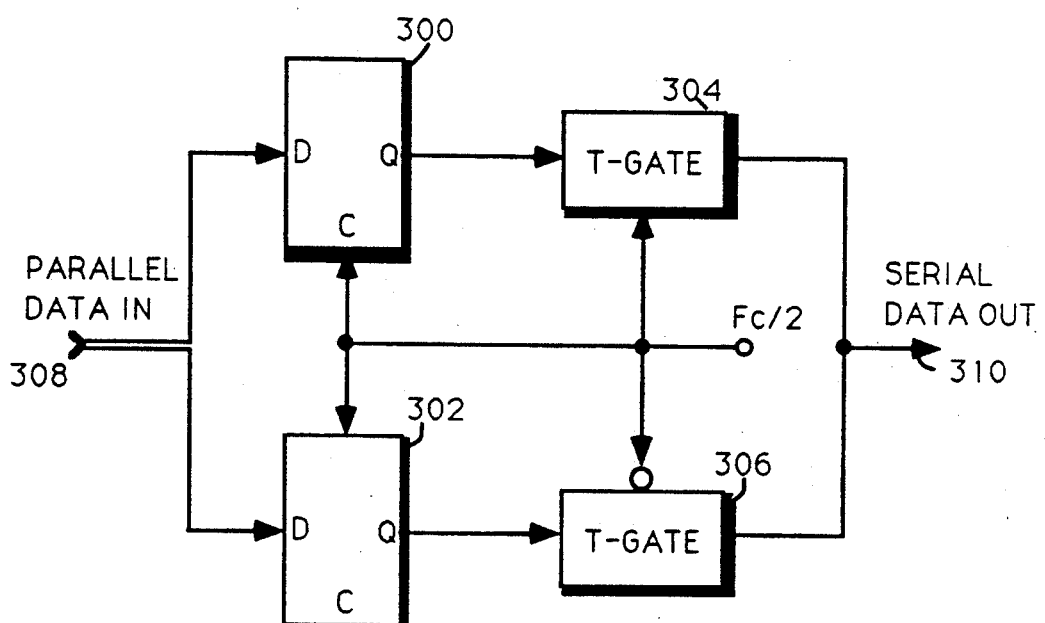
FIGS. 3 and 6 are schematic logic diagrams of exemplary demultiplexers which may be utilized in the functional elements of FIG. 1B.
Figure 6:
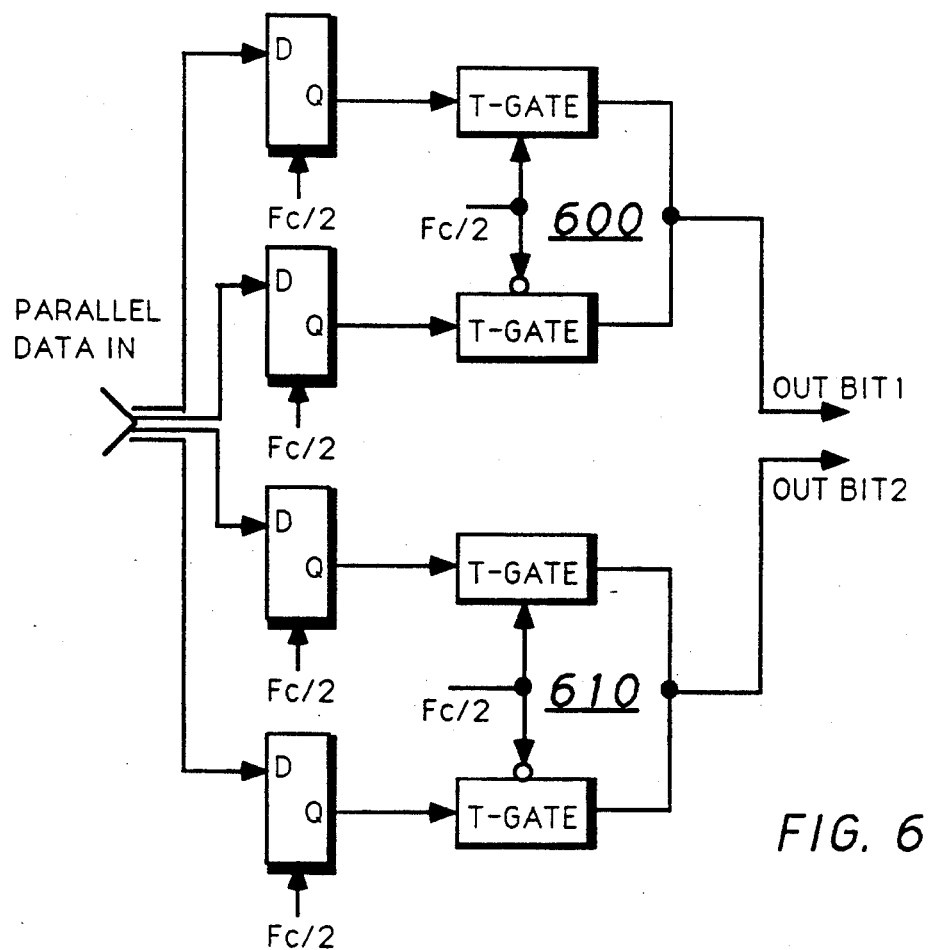

FIG. 3 illustrates a two-to-one signal multiplexer and FIG. 6 illustrates a four-to-two signal multiplexer. The FIG. 6 apparatus is actually two multiplexers 600 and 610 of the FIG. 3 type operating in parallel.

Figure 4:
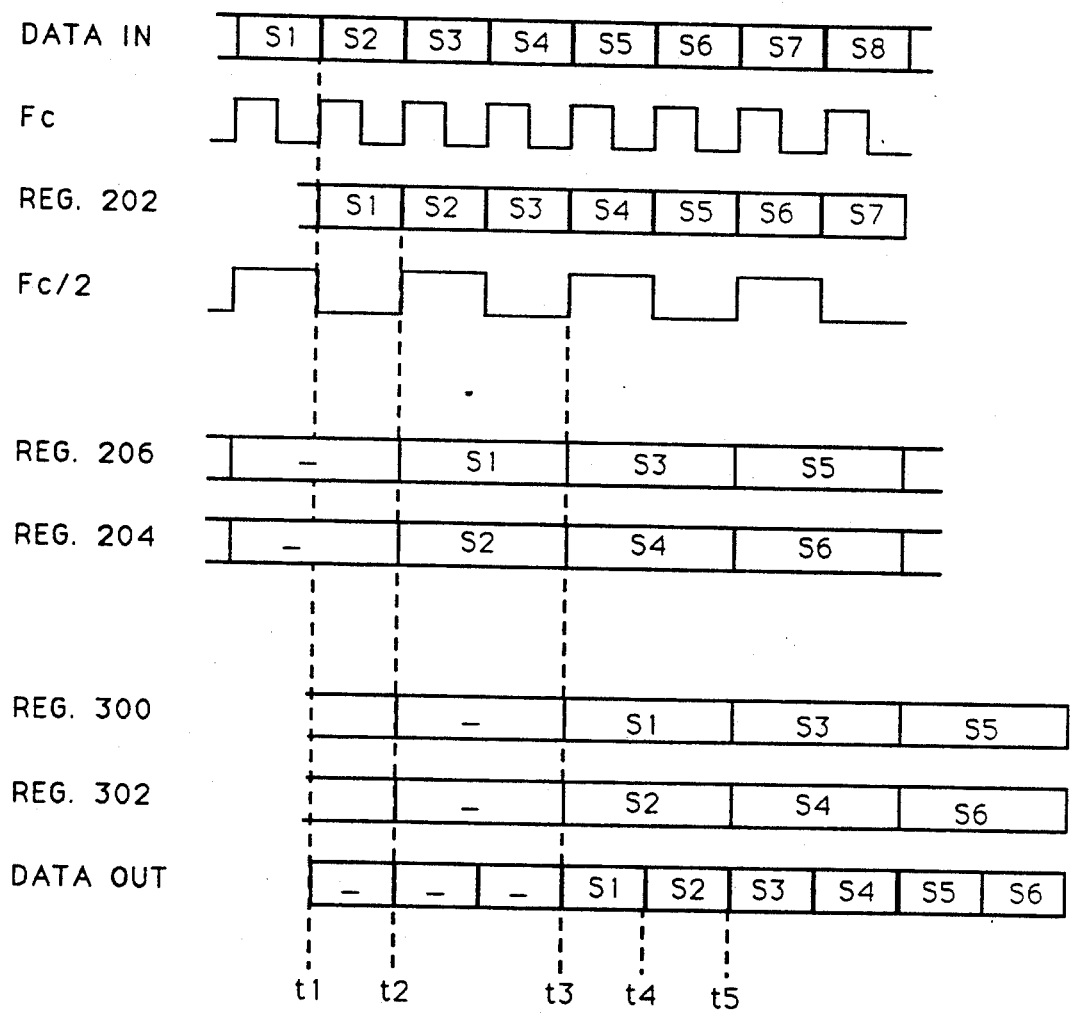
FIG. 4 is a pictorial representation of the relative timing of signals passed by the FIG. 2 and FIG. 5 circuits, useful for understanding the operation of the FIG. 2 and 5 circuitry.

An understanding of the operation of the multiplexer of FIG. 3 is aided by reference to the signals REG. 300, REG. 302 and Data Out illustrated in FIG. 4. Parallel input data applied to the connection 308 corresponds to the signals REG. 206 and REG. 204. Thus for example the sample bits S1 and S2 are concurrently applied to register 300 and register 302 respectively. At the end of the input bit period (t3) these bits are latched into registers 300 and 302, responsive to the clock signal Fc/2, and exhibited at their respective Q output terminals. Output signal from register 300 is applied to a transmission gate 304 and output signal from register 302 is applied to a transmission gate 306. The output ports of the transmission gates 304 and 306 are interconnected at a bit-serial DATA out terminal 310.

The transmission gates 304 and 306 operate in complementary fashion responsive to the clock signal Fc/2. That is, for the half period that the clock signal Fc/2 exhibits a high state, (e.g., time t3-t4) the transmission gate 304 passes the signal bit provided by the register 300, and for the half period that the clock signal Fc/2 exhibits a low state (e.g., time t4-t5), the transmission gate 306 passes the signal bit provided by the register 302. During the half period that the clock signal Fc/2 exhibits a low (high) state the transmission gate 304 (306) is open circuited providing a high impedance to the output terminal. The output signal DATA OUT at connection 310 is an interleaved version of the two DATA IN signals and occurs at twice the input data rate. This signal is applied to the internal circuitry of the respective functional element.

The multiplexers and demultiplexers impart delays to the signals processed, which delays may have to be compensated. For example, in FIG. 1B, if the functional element 16 were replaced by two series connected functional elements each having respective multiplexers and demultiplexers, a compensating delay corresponding to the delay of a multiplexer-demultiplexer combination may have to be included in the functional element 14 to insure temporal registration of the two signals applied to the functional element 18.

As described above, the latches of FIG. 3 are clocked by the clock signal Fc/2. However for some applications it is advantageous to clock these latches with the complement of the clock signal Fc/2. It is possible in some IC arrangements that the half rate clock signals applied to the a demultiplexer may be skewed relative to the half rate clock signal applied to a multiplexer to which corresponding data is communicated. In such instances the timing of the data applied to the multiplexer will also be skewed relative to the half rate clock signal applied to the multiplexer. This clock skew may be compensated by operating the demultiplexer and multiplexer with antiphase clock signals. In this mode, interfunction data with skew of up to one half of the period of the half rate clock signal may be resynchronized. There is a disadvantage in that the transit time of the data between functional elements is reduced. However at some junctures clock skew may be the rate limiting parameter, rather than data transit time, and therefore the total system rate will be enhanced by use of antiphase clocks.

The invention has been described in terms of bit-serial signals. It is contemplated however that the invention may be implemented in nibble-serial systems. Nibble-serial systems are systems which process plural-bit signal in bit-serial format. For example an 8-bit sample may be divided into 4 two-bit nibbles and the nibbles are processed as bit-serial signals. The circuits of FIGS. 5 and 6 are conductive to parsing a two-bit nibble-serial signal at rate f into two two-bit nibble-serial signals of rate fc/2 and then recombining them respectively. In this instance the two signals BIT1 and BIT2, shown in FIG. 5, correspond to the two-bit nibble-serial signal. In the claims the term bit-serial is intended to incorporate nibble-serial.

What is claimed is:

1. An improved high speed bit-serial signal processing system including a plurality of interconnected bit-serial functional elements, exclusive of transmission media, for operation at a bit rate f tending to cause timing errors between said functional elements, the improvement comprising:
respective demultiplexing means, coupled to respective output connections of ones of said bit-serial functional elements, for parsing bit-serial signals of bit-rate f provided thereby, into N bit-serial signals each of bit-rate f/N, where N is an integer greater than one; and
respective multiplexing means, coupled without intervening processing circuitry to said respective demultiplexing means, for combining said N bit-serial signals of bit-rate f/N into single bit-serial signals of rate f and providing said single bit-serial signals to respective input connections of others of said bit-serial functional elements.

2. An integrated circuit comprising:
a source of a master clock signal;
a plurality of bit-serial digital signal processing elements, for processing bit-serial signals at a bit-rate f;
a clock signal generator, responsive to said master clock signal for generating clock signals of rate f and f/N, where N is an integer, greater than one;
a demultiplexer, coupled to an output connection of one of said bit-serial digital signal processing elements, and responsive to a bit-serial signal of bit-rate f provided thereby and to said clock signals of rate f and f/N, for parsing said bit-serial signal of bit-rate f into N parallel bit-serial signals of bit-rate f/N;
a multiplexor, coupled without intervening processing circuitry to output connections of said demultiplexer, for combining said N parallel bit-serial signals of bit-rate f/N into a single bit-serial signal of bit-rate f, and providing said single bit-serial signal of bit-rate f to an input connection of another of said bit-serial digital signal processing elements.

3. A bit-serial processing system comprising:
a source of a master clock signal;
a source of input signal;
a plurality of interconnected integrated circuits, each of which includes a plurality, including one, of bit-serial signal processing circuits and a clock signal generating circuit, said processing circuits being exclusive of transmission media, said clock signal generating circuit being responsive to said master clock signal for generating clock signals to operate said plurality of bit-serial signal processing circuits, said generated clock signals having frequencies greater than said master clock signal, and wherein ones of said bit-serial signal processing circuits within an integrated circuit are interconnected by means for splitting a bit-serial signal of bit-rate f provided by one of said bit-serial signal processing circuits into parallel bit-serial signals of lesser bit-rate, and means, coupled without intervening processing elements to said means for splitting, for recombining said parallel bit-serial signals into a single bit-serial signal; and
means for applying said input signal to one of said integrated circuits.

4. The bit-serial processing system set forth in claim 3 wherein said clock signal generating circuit provides a clock signal of frequency f and a clock signal of frequency f/N, where N is an integer greater than one and which corresponds to the number of said parallel bit-serial signals, and f is a frequency which is greater than the frequency of the master clock signal.

5. The bit-serial processing system set forth in claim 4 wherein said means for splitting a bit-serial signal of bit-rate f into parallel bit-serial signals comprises:

a demultiplexer, coupled to an output connection of one of said bit-serial signal processing circuits, and responsive to a bit-serial signal of bit-rate f provided thereby and to said clock signals of rate f and f/N, for parsing said bit-serial signal of bit-rate f into N parallel bit-serial signals of bit-rate f/N; and wherein said means for recombining said parallel bit-serial comprises:

a multiplexor, having input connections coupled to said demultiplexer, for combining said N parallel bit-serial signals of bit-rate f/N into a single bit-serial signal of bit-rate f, and providing said single bit-serial signal of bit-rate f to an input connection of one of said bit-serial signal processing circuits.

* * * * *